United States Patent
Yano (10) Patent No.: US 9,183,934 B2
(45) Date of Patent: Nov. 10, 2015

(54) SPLIT BLOCK SEMICONDUCTOR MEMORY DEVICE

(71) Applicant: Winbond Electronics Corp., Taichung (TW)

(72) Inventor: Masaru Yano, Tokyo (JP)

(73) Assignee: WINBOND ELECTRONICS CORP., Taichung (TW)

( * ) Notice: Subject to any disclaimer, the term of this patent is extended or adjusted under 35 U.S.C. 154(b) by 399 days.

(21) Appl. No.: 13/744,965

(22) Filed: Jan. 18, 2013

(65) Prior Publication Data
US 2014/0043906 A1    Feb. 13, 2014

(30) Foreign Application Priority Data
Apr. 24, 2012 (JP) .................................. 2012-098795

(51) Int. Cl.
| | |
|---|---|
| G11C 16/08 | (2006.01) |
| G11C 16/10 | (2006.01) |
| G11C 16/24 | (2006.01) |
| G11C 16/04 | (2006.01) |
| G11C 16/16 | (2006.01) |
| G11C 16/34 | (2006.01) |

(52) U.S. Cl.
CPC ............ *G11C 16/08* (2013.01); *G11C 16/0483* (2013.01); *G11C 16/10* (2013.01); *G11C 16/16* (2013.01); *G11C 16/24* (2013.01); *G11C 16/3418* (2013.01); *G11C 2216/18* (2013.01)

(58) Field of Classification Search
CPC .... G11C 16/0483; G11C 16/10; G11C 16/14; G11C 16/16; G11C 16/3418; G11C 16/3427; G11C 2216/18
See application file for complete search history.

(56) References Cited

U.S. PATENT DOCUMENTS

| | | | |
|---|---|---|---|
| 6,295,227 B1 | 9/2001 | Sakui et al. | |
| 6,850,439 B1 * | 2/2005 | Tanaka | 365/185.17 |
| 6,903,981 B2 * | 6/2005 | Futatsuyama et al. | 365/185.33 |
| 7,193,897 B2 * | 3/2007 | Lee | 365/185.17 |
| 7,652,931 B2 * | 1/2010 | Park et al. | 365/185.29 |

(Continued)

FOREIGN PATENT DOCUMENTS

| | | |
|---|---|---|
| JP | 2000222895 | 8/2000 |
| JP | 2006190440 | 7/2006 |

(Continued)

OTHER PUBLICATIONS

Korean Office Action for Korean Application No. 10-2012-0106130 dated Sep. 25, 2013 with English translation.
Office Action of corresponding Taiwanese patent application No. 101131695 issued on Oct. 27, 2014.

*Primary Examiner* — Harry W Byrne
*Assistant Examiner* — Lance Reidlinger
(74) *Attorney, Agent, or Firm* — Muncy, Geissler, Olds & Lowe P.C.

(57) ABSTRACT

A flash memory capable of writing or deleting a split block is provided. A flash memory includes a memory array comprising a plurality of blocks, and a word line selection circuit, wherein each of the plurality of blocks is formed by a plurality of cell units in a well. The cell unit comprises N memory cells, a selection transistor coupled to one terminal of the memory cells, a selection transistor coupled to the other terminal of the memory cells, and a dummy selection transistor coupled between the memory cells. The word line selection circuit splits the block into a first block and a second block to use according to the operation of data writing or data deleting.

17 Claims, 7 Drawing Sheets written local bit line local bit line with write protection (56) References Cited

U.S. PATENT DOCUMENTS

| | | |
|---|---|---|
| 7,804,718 B2 * | 9/2010 | Kim .................... 365/185.29 |
| 8,065,470 B2 * | 11/2011 | Yano et al. ................. 711/103 |
| 2006/0140001 A1 | 6/2006 | Lee |
| 2008/0007999 A1 | 1/2008 | Park et al. |

FOREIGN PATENT DOCUMENTS

| | | |
|---|---|---|
| JP | 2006302960 A | 11/2006 |
| JP | 2009088446 | 4/2009 |
| KR | 10-2006-0075361 A | 7/2006 |
| KR | 10-2008-0005765 A | 1/2008 |

* cited by examiner

| Mode | GBL | SGD | WL (U) Selected | WL (U) Unselected | DSG | WL (L) Selected | WL (L) Unselected | SGS | SL |
|---|---|---|---|---|---|---|---|---|---|
| Delete (U) | floating | floating | 0v | 0v | floating | floating | floating | floating | floating |
| Delete (L) | floating | floating | floating | floating | floating | 0v | 0v | floating | floating |
| Write (U) | 0/2.4v | 5->1.5v | 18 | 10 | 0v | 4.2 | 4.2 | 5->1.5v | 2.4v |
| Write (L) | 0/2.4v | 5->1.5v | 4.2 | 4.2 | 5->1.5v | 18 | 10 | 0v | 2.4v |
| Read | 1.2v | 4.2v | 0 | 4.2 | 4.2v | 4.2 | 4.2 | 4.2v | 0v |

(U) : Upper block
(L) : Lower block

SPLIT BLOCK SEMICONDUCTOR MEMORY DEVICE

CROSS REFERENCE TO RELATED APPLICATIONS

This application claims priority of Japan Patent Application No. 2012-098795, filed on Apr. 24, 2012, the entirety of which is incorporated by reference herein.

BACKGROUND OF THE INVENTION

1. Field of the Invention

The disclosure relates generally to a non-volatile semiconductor memory device, and more particularly, to a memory block of a NAND flash memory.

2. Description of the Related Art

Flash memories are broadly used in storage devices, and electrical devices, such as digital cameras, and smart phones. Current flash memory demand functionalities include small sizes, high capacities, high speeds, and low power consumption. In addition, flash memories having fixed times and the data holding is also needed.

A NAND flash memory comprises a memory array formed by a plurality of blocks, wherein the plurality of blocks is formed by a plurality of NAND strings arranged in a row. The NAND string has selection transistors coupled to each of two terminals of memory cells connected in series, wherein one terminal is connected to a bit line via the selection transistor, and the other terminal is connected to a source line via the selection transistor. Data reading or writing (programming) is performed via the bit line connected to the NAND string, such as the flash memory with improved data programming speed as disclosed by Patent Document Japan Patent Publication No. 2006-302960.

PRIOR ART DOCUMENTS

[Patent Document 1] Japan Patent Publication No. 2006-302960

BRIEF SUMMARY OF THE INVENTION

The Problem to be Solved

Flash memory capacity increases due to the semiconductor miniaturization, wherein the number of pages and the page capacity in a memory block has also increased. When the memory block capacity increases, the amount of deletable data increases, and the amount of read/write data also increases. On the other hand, when the amount of deletable data increases, the operation of memory recycling becomes more complicated. Also, when the number of pages (or word lines) in a memory block increases the write disturb problem worsens. In addition, the number of word lines in a block is 64, the number of word line with write protection becomes a multiple of 32, however, this is not necessary.

The invention provides a semiconductor memory device capable of using portions of a block formed by a large number of pages.

Also, the invention provides a semiconductor memory device capable of writing or deleting data in a block or a split block.

Solutions of the Problem

An embodiment of a semiconductor memory device, for writing or deleting data in a block is provided, comprising: a memory array, comprising a plurality of blocks, wherein each block of the plurality of blocks is formed by a plurality of cell units in a well; and a selection circuit, selecting the block, and selecting a memory cell of the cell unit of the selected block, wherein the cell unit comprises N memory cells connected in series, and a first selection transistor is coupled between a terminal of the N memory cells and a source line, a second selection transistor is coupled between another terminal of the N memory cells and a bit line, and a third selection transistor is coupled in the middle of the N memory cells, wherein the gates of the memory cells in the row direction in the block are connected to a word line, the gate of the first selection transistor is coupled to a first selection line, the gate of the second selection transistor is coupled to a second selection line, and the gate of the third selection transistor is coupled to a third selection line, and wherein the selection circuit drives the word line, the first selection line, the second selection line and the third selection line, and utilizes the third selection transistor as a boundary to divide the block into a first block and a second block according to an operation of data writing or deleting.

A preferred embodiment of semiconductor memory device is provided, further comprising: a control circuit, controlling the selection circuit according to an instruction, wherein the instruction is whether the selection circuit divides the block. A preferred embodiment of semiconductor memory device is provided, wherein when data deletion in the first block is processed, a first voltage is applied to the gate of each memory cell in the first block via the word line, the third selection transistor is floating via the third selection line, the memory cells in the second block are floating, the first selection transistor and the second selection transistor are floating, and a second voltage larger than the first voltage is applied to the well.

A preferred embodiment of semiconductor memory device is provided, wherein when data deletion in the second block is processed, a first voltage is applied to the gate of each memory cell in the second block via the word line, the third selection transistor is floating via the third selection line, the memory cells in the first block is floating, the first selection transistor and the second selection transistor are floating, and a second voltage larger than the first voltage is applied to the well.

A preferred embodiment of semiconductor memory device is provided, wherein when data deletion in the first block and the second block is processed, a first voltage is applied to the gate of each memory cell in the first block and the second block via the word line, the third selection transistor is floating via the third selection line, the first selection transistor and the second selection transistor are floating, and a second voltage larger than the first voltage is applied to the well.

A preferred embodiment of semiconductor memory device is provided, wherein when data writing in the first block is processed, a programming voltage is applied to the gate of each memory cell in the first block via the word line, the third selection transistor is turned on via the third selection line, a middle voltage which is sufficient to turn on the memory cell is applied to the gate of each memory cell in the second block via the word line, the first selection transistor is turned off by the first selection line, and the second selection transistor is connected to the bit line via the second selection line.

A preferred embodiment of semiconductor memory device is provided, wherein when writing data in the second block is processed, a programming voltage is applied to the gate of each memory cell in the second block via the word line, the third selection transistor is turned off via the third selection line, a middle voltage which is sufficient to turn on the memory cell is applied to the gate of each memory cell in the first block via the word line, the first selection transistor is connected to the source line via the first selection line, and the second selection transistor is connected to the bit line via the second selection line.

A preferred embodiment of semiconductor memory device is provided, wherein when writing data in the first block is processed, a local bit line of the cell units connected to a write protection line in the first block and the second block is pre-charged, and the local bit line of the first block is boosted in response to the middle voltage.

A preferred embodiment of semiconductor memory device is provided, wherein when writing data in the second block is processed, a local bit line of the cell units connected to a write protection line in the first block and the second block is pre-charged and the local bit line of the second block is boosted in response to the middle voltage.

A preferred embodiment of semiconductor memory device is provided, wherein when reading data from the second block is processed, the word line provides a reading voltage to the gate of the selected memory cell, a middle voltage is applied to the gate of the unselected memory cell in the first block and the second block, and the third selection transistor is turned on via the third selection line. A preferred embodiment of semiconductor memory device is provided, wherein each of the first block and the second block has N/2 word lines.

Effects of the Invention

According to the present invention, a block can be divided into a first block and a second block to use, and a high-integrated block which has many memory cells (or pages) can be divided into split blocks with less memory cells (or pages) to use. Also, a problem about the writing disturb can be avoid by dividing block.

DETAILED DESCRIPTION OF THE INVENTION

Structures for Embodiments of the Invention

The embodiment of the invention will become more fully understood by referring to the following detailed description with reference to the accompanying drawings. Also, in order for easier identification, some portion shown in drawings may be emphasized. Therefore, it should be noted that the scale of the drawings may not be the same as the actual device.

Embodiments

Figure 1:
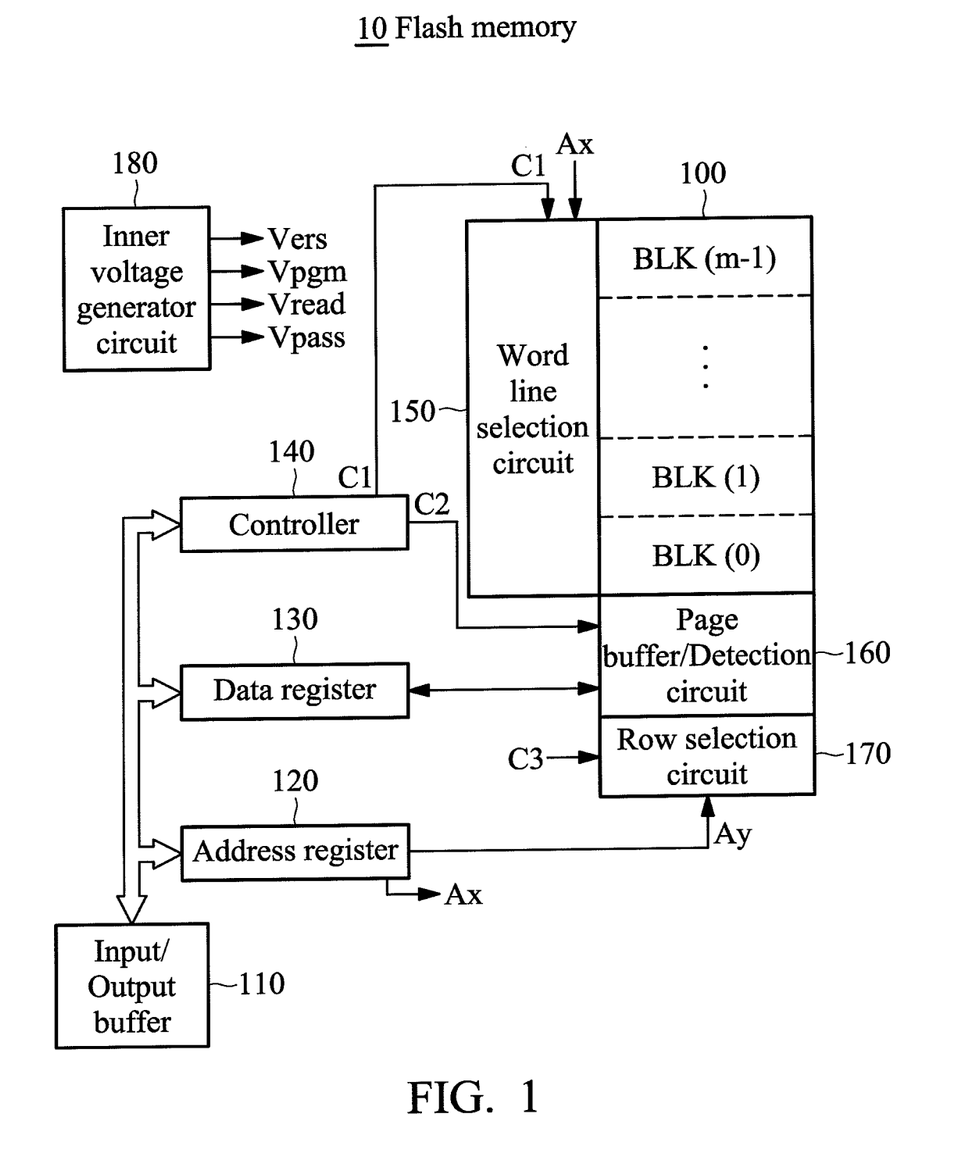
FIG. 1 is a schematic diagram illustrating a normal flash memory.

FIG. 1 is a schematic diagram illustrating a normal flash memory. The structure of this flash memory is only an example, and the invention is not limited thereto.

The flash memory 10 of the embodiment comprises a memory array 100 having memory cells arranged in a columns and rows, an input/output buffer 110 buffering input/output data connected to an external input/output terminal I/O, an address register 120 receiving address data from the input/output buffer 110, a data register 130 temporarily storing input/output data, a controller 140 receiving instruction data from the input/output buffer 110, and controlling each unit by providing control signals C1, C2 and C3, a word line selection circuit 150 selecting the block and a word line according to the decoding result of column address information Ax from the address register 120, a page buffer/detection circuit 160 temporarily storing data read from the page selected by the word line selection circuit 150, a row selection circuit 170 selecting the bit line according to the decoding result of row address information Ay from the address register 120, and an inner voltage generator circuit 180 generating necessary voltages for reading, programing and deleting (writing voltage Vpgm, passing voltage Vpass, reading voltage Vread, deleting voltage Vers, etc.).

Figure 2:
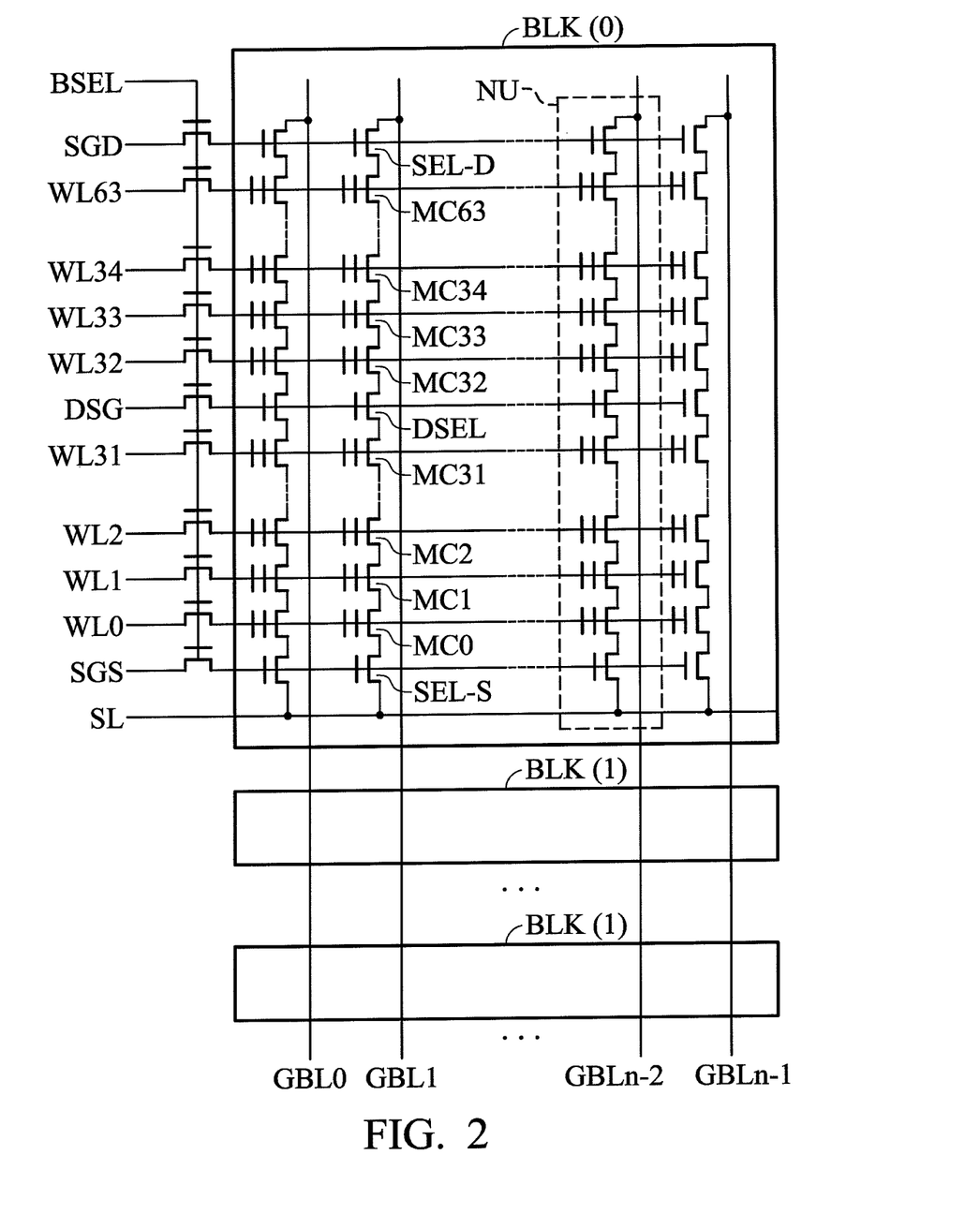
FIG. 2 is a schematic diagram illustrating an embodiment of a memory block and cell unit of a flash memory according to the invention.

In an embodiment of the invention, a memory array 100 has m blocks BLK(L)0, BLK(L)2, ..., BLK(L)m−1 arranged in a row. FIG. 2 is a structure diagram illustrating a NAND string formed in a memory block, and the relationship between the block and the word line selection circuit 150. A memory block has a plurality of NAND strings, and a NAND string (called as cell unit NU hereafter) is a plurality of memory cells connected in series, wherein each of the cell units NU is arranged in a column. The cells units NU arranged in a column are formed in a well, such as a P well, and a plurality of the cell units NU form a memory block. As shown in the figure, a memory block comprises n bits cell units NU.

A cell unit NU comprises N memory cells MCi (i=0, 1, ..., N−1) connected in series, a source selection transistor SEL-S and a drain selection transistor SEL-D respectively connected to two terminals of the cell unit NU in series, and a dummy selection transistor DSEL connected to the middle of the cell unit NU in series. In this embodiment, the cell unit NU comprises 64 memory cells. Therefore, the memory block in the embodiment is formed by 64 times n pages.

The gate of each memory cell MC1 is coupled to the corresponding word lines WL0~WL63, respectively. The drain of the source selection transistor SEL-S is coupled to the source of the memory cell MC0, the source of the source selection transistor SEL-S is coupled to the common source line SL, and the gate of the source selection transistor SEL-S is coupled to the source selection line SGS. The source of the drain selection transistor SEL-D is coupled to the drain of the memory cell MC63, the drain of the drain selection transistor SEL-D is coupled to the corresponding globe bit line GBL, and the gate of the drain selection transistor SEL-D is coupled to the drain selection line SGD. The source of the dummy selection transistor DSEL is coupled to the drain of the memory cell MC31, the drain of the dummy selection transistor DSEL is coupled to the source of the memory cell MC32, and the gate of the dummy selection transistor DSEL is coupled to the dummy selection line DSG.

The word lines WL0-WL63, the source selection line SGS, drain selection line SGD, and the dummy selection line DSG are connected to the word line selection circuit 150 by the block selection transistor having the gate common inputted with block selection line BSEL. When the word line selection circuit 150 selects a block, the block selection line BSEL turns on the block selection transistor.

The memory MC1 formed in a block, the source selection transistor SEL-S, the drain selection transistor SEL-D, and the dummy selection transistor DSEL, have an NMOS transistor formed in a P well. The memory cell comprises a source/drain with an N-type diffusion area, a tunnel oxide film formed between the source and the drain, a floating gate (charge accumulation layer) accumulating charges generated by the tunnel oxide film, and a control gate formed by a dielectric film on the floating gate. Generally speaking, when there is no charge accumulating in the floating gate, namely the write data is "1", the threshold value is a minus value, and the memory cells are turned on. When there is a charge accumulating in the floating gate, namely the write data is "0", the threshold value is a positive value, and the memory cells are turned off.

The control gate of the memory cell MCi of each cell unit arranged in a column are common connected to a corresponding word line WLi. Similarly, the source selection transistor SEL-S is common connected to the source selection line SGS, the drain selection transistor SEL-D is common connected to the drain selection line SGD, and the dummy selection transistor DSEL is common connected to the dummy selection line DSG. The word line selection circuit 150 selects a block according to the column address information Ax, and provides a predetermined voltage to drive the source selection line SGS, the drain selection line SGD and the dummy selection line DSG of the selected block according to an operation state. The necessary voltages are provided by the inner voltage generator circuit 180, and the inner voltage generator circuit 180 comprises a charging pump circuit.

In a preferred embodiment, the globe bit lines GBL0, GBL1, . . . , GBLn−1 connected to the cell unit are connected to the page buffer/detection circuit 160 by the bit line selection circuit. The bit line selection circuit selects even bit lines or odd bit lines when reading or programming, and connects the selected even bit lines or odd bit lines to the page buffer/detection circuit 160. The even bit lines and the odd bit lines share the detection circuit 160, and the page buffer/detection circuit 160 comprises a detection circuit for a page when each of the even bit lines and the odd bit lines forms a page. The detection circuit 160 detects the voltage level of the even bit lines or odd bit lines during reading operations, and the detection circuit 160 holds the data written in the even bit lines or odd bit lines during the programming operations. The row selection circuit 170 selects a bit line according to the row address information Ay, writes data to the selected bit line, or read data from the selected bit line.

Figure 3:
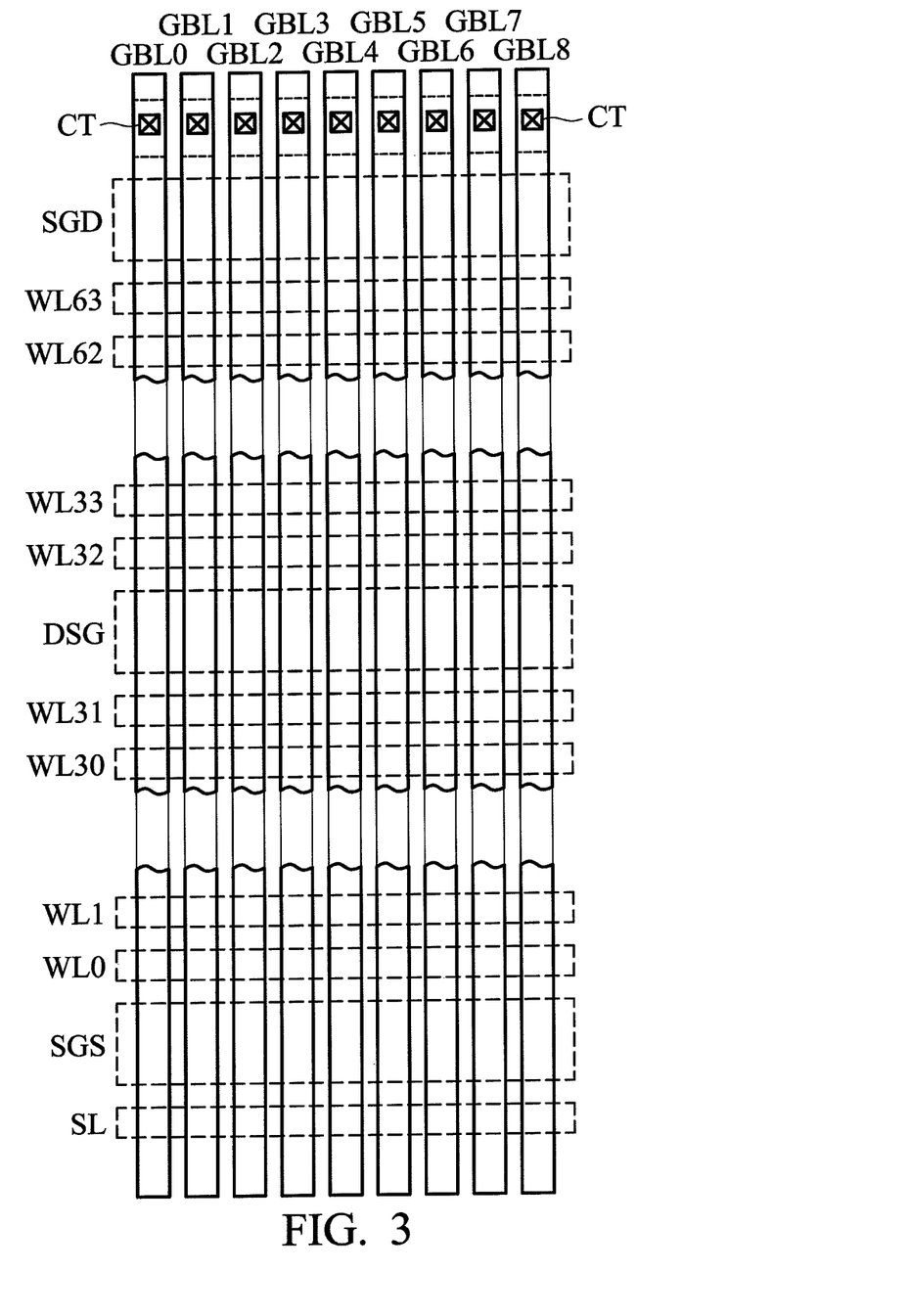
FIG. 3 is a plan diagram illustrating an embodiment of cell units according to the invention.
Figure 4:
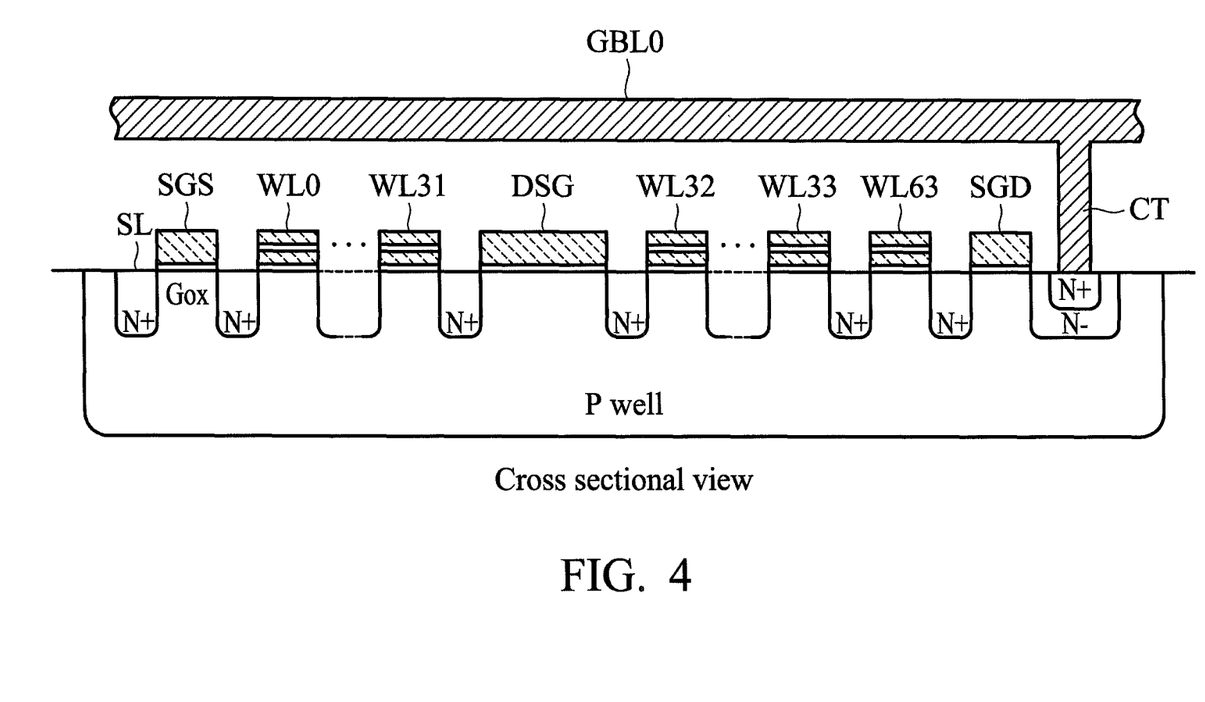
FIG. 4 is cross sectional view illustrating an embodiment of the cell unit according to the invention.

FIG. 3 is a plan diagram illustrating an embodiment of cell units in a block according to the invention, and FIG. 4 is cross sectional view of the cell unit shown in FIG. 3 along the globe bit line GBL0. A P well is formed in the N-type silicon substrate or an N well, wherein the plurality of blocks are formed in well. The source/drain of each of the transistors of the cell unit NU has an N-type diffusion area formed in the P-type well, and the N-type diffusion area is formed parallel to the globe bit line GBL. The adjacent diffusion areas can be divided by STI. The memory cell comprises a source/drain with an N-type diffusion area, a tunnel between the source and the drain, a polysilicon N-type floating gate formed via the gate oxide film Gox of the tunnel, and a N-type control gate formed by a dielectric film on the floating gate. Each of the source selection transistor SEL-S, the drain selection transistor SEL-D and the dummy selection transistor DSEL, is formed by a single N-type polysilicon gate, and the polysilicon gate does not include the dielectric film between the floating gate and the control gate. The dummy selection transistor DSEL is coupled between the memory cell MC31 and the memory cell MC32, so that the dummy selection transistor DSEL is located in the middle of 64 word lines. The common source line SL has an N+ diffusion area in a P well, and shares it with the source selection transistor SEL-S. Also, the drain of the drain selection transistor SEL-D is connected to the globe bit line GBL by a contact CT.

Figure 5:
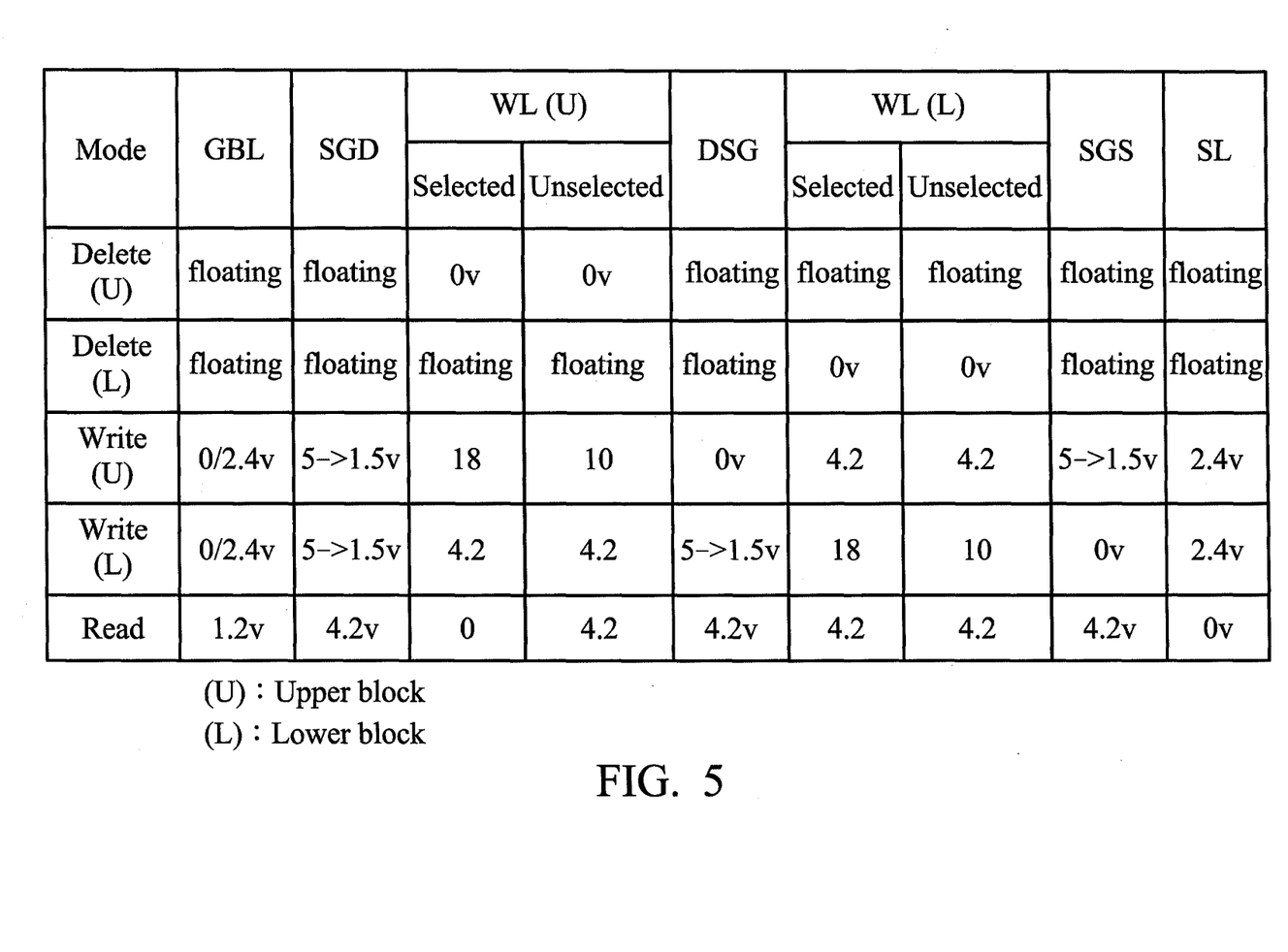
FIG. 5 is a list illustrating an embodiment of the voltages provided in the flash memory at different operations.

The operation of the flash memory is explained in the following description. The word line selection circuit 150 performs the operation of data reading, writing, or deleting according to the instruction from the controller 140, and provides a predetermined voltage to drives the block selection line BSEL, the word line WL, the source selection line SGS, the drain selection line SGD, and the dummy selection line DSG. Also, the voltages except the power voltage Vcc can be generated by the inner voltage generator circuit 180. FIG. 5 is a list illustrating the voltages provided to each unit for different operations.

The flash memory of the embodiment according to the invention not only has functions for deleting block data, reading and writing page data, it also has functions for dividing a block into portion of blocks. Regarding the usage of the portion of blocks, by using the dummy selection transistor DSEL as a boundary, the lower block comprising the memory cells MC0 -MC31 and the upper block comprising the memory cells MC32-MC63 can be operated individually. For example, to delete data in the lower block, to delete data in the upper block, to write page data in the lower block, or to write page data in the upper block can be performed.

Therefore, in the embodiment according to the invention, the flash memory has a block with more pages (64 pages) and a larger capacity, and a block with fewer pages (32 pages) and a smaller capacity, so that a block can work as two blocks. In the embodiment of the invention, a user can not only use the block with 32 pages, but also use the block with 64 pages. In a preferred embodiment of a division of a block, an external controller outputs a corresponding instruction to the flash memory 10, and the controller 140 controls the word line 150 according the decoding result of the instruction, so that the block can be used as a upper block and a lower block. The related operations are described in following description.

(Data Deleting)

When data deletion in the upper block is processed, namely data deletion in the block comprising the memory cells MC32-M63, the block selection line BSEL is provided with a high level voltage to turn on all of the block selection transistors, such that the block is selected. Next, a voltage with 0V is applied to the word lines WL32-WL63 to select the word lines WL32-WL63 of the upper block. Meanwhile, for the word lines WL0-WL31 which are not selected, the word lines WL0-WL31 are floating. Next, the dummy selection line DSG, the globe bit lines GBL0-GBL(n−1), the source selection line SGS, the drain selection line SGD, and the source line SL are floating, and a deletion voltage Vers with 20V is applied to the P well.

Due to a voltage with 0V being applied to the memory cells MC32-MC63 of the upper block, electrons are pulled from the floating gate to the P well. On the other hand, due to the capacity coupling of the P well, the control gate of the memory cells MC0-MC31 of the lower block is boosted to 20V, so that the channel current does not flow, and data deletion is not performed.

Figure 6:
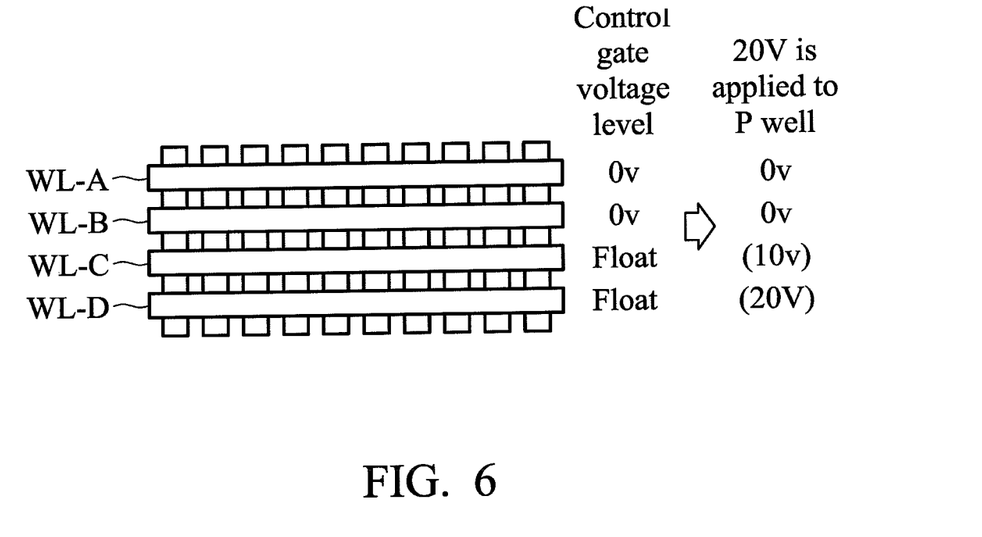
FIG. 6 is a diagram illustrating an error occurring when deleting a portion of data of a block without a dummy selection transistor.

FIG. 6 is a diagram illustrating an error occurring when deleting a portion of data of a block without a dummy selection transistor DSEL between the upper block and the lower block. For example, a voltage with 0V is applied to the word line WL-A and WL-B in the upper block, and the word line WL-C and WL-D are floating. When a deletion voltage with 20V is applied to the P well, the control gate cannot be boosted sufficiently, such as 10V, because the control gate of the memory cell (word line WL-C) is capacity coupled to the control gate of the neighbored memory cell (word line WL-B). In this situation, data in the lower block may be deleted falsely. In comparison with an embodiment of the invention, due to a dummy selection transistor DSEL being inserted between the upper block and the lower block, to distance the upper block from the lower block, the capacity coupling of the gate of the memory cell MC31 and the memory cell MC32 can be reduced. Therefore, the capacity coupling of P well can be boosted to 20V. In order to perform the capacity decoupling, the distance between the word line WL31 and the word line WL32 is longer, and the length of the gate of the dummy selection transistor DSEL it longer than the length of the gate of the other word line.

When data deletion in the lower block is processed, namely data deletion in the block comprising the memory cells MC0-MC31, the word lines WL0-WL31 of the lower block are selected, a voltage with 0V is applied to the word lines WL0-WL31, the word lines WL32-WL63 are floating, and the dummy selection line DSG is floating. A deletion voltage Vers with 20V is applied to the P well, and the data deletion is performed as similar to the data deletion of the upper block.

(Data Writing)

Next, the data writing in the upper block is described in the following description. At first, the block is selected by the block selection line BSEL. A voltage with 0V is applied to the globe bit line GBL for a writing operation, a voltage with 2.4V is applied to the globe bit line GBL with write protection, and a voltage with 5V is applied to the drain selection line SGD for turning on the drain selection transistor SEL-D. A power level voltage Vcc with 2.4V is applied to the source line SL, and a voltage with 5V is applied to the source selection line SGS for turning on the source selection transistor SEL-S. A voltage with 0V is applied to the dummy selection line DSG for turning off the dummy selection transistor DSEL. A voltage with 0V is applied to the P well. A programming voltage Vpgm with 18V is applied to the selected word line in the upper block, and a passing voltage Vpass with 10V is applied to the unselected word line. Also, a middle voltage with 4.2V is applied to all of the word lines in the lower block.

At about the same time as the word line is driven, the voltages of the drain selection line SGD and the source selection line SGS decrease to 1.5V. In the upper block, the memory cell selected by the bit line use the voltage difference between the voltage of the channel (0V) and the voltage of the control gate (18V) to inject electrons to the floating gate. Due to the passing voltage Vpass with 10V being applied to the unselected word lines, the control gate of the unselected word lines are not injected electrons. Also, due to the channel being pre-charged, the channel is boosted as the word line, and the memory cells corresponding to the word line with write protection are not injected electrons.

On the other hand, in the lower block, the dummy selection transistor DSEL is turned off, and all of the channels (local bit line) are pre-charged by the source line SL. A voltage with 4.2V is applied to word line WL0-WL31. Due to the voltage of the channel being boosted by capacity coupling to the control gate, data writing will not be performed.

Next, the data writing in the lower block is described in the following description. In this case, a voltage with 5V is applied to the dummy selection line DSG for turning on the dummy selection transistor DSEL. This case is different from the data writing in the upper block, wherein a voltage with 0V is applied to the source selection line SGS for turning off the source selection transistor SEL-S. The other provided voltages in this case of data writing in the lower block are the same as the case of data writing in the upper block.

Figure 7A:
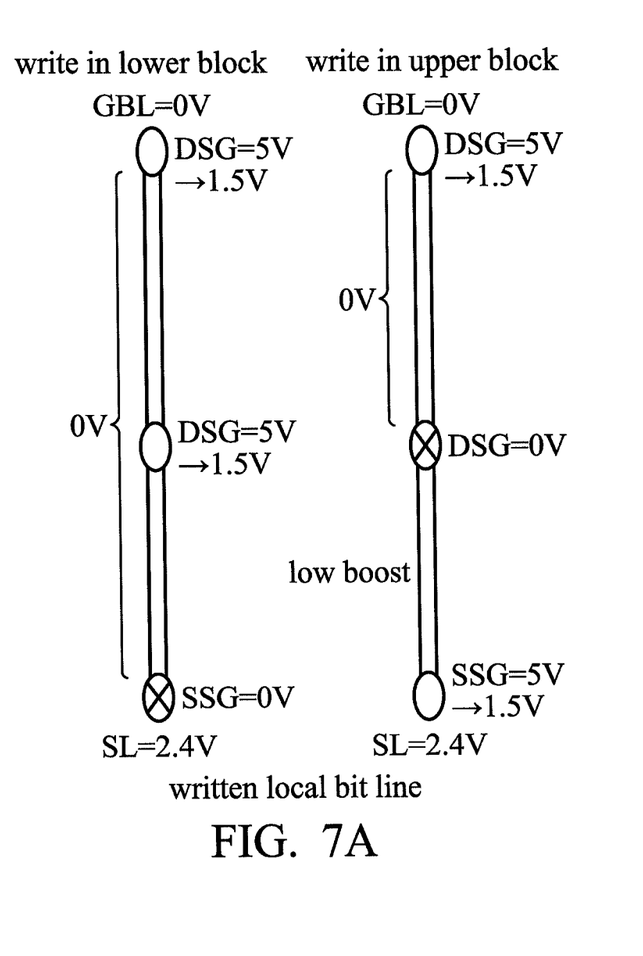
FIGS. 7A and 7B are diagrams illustrating a status of the local bit line when data writing in the upper block or the lower block is processing.
Figure 7B:
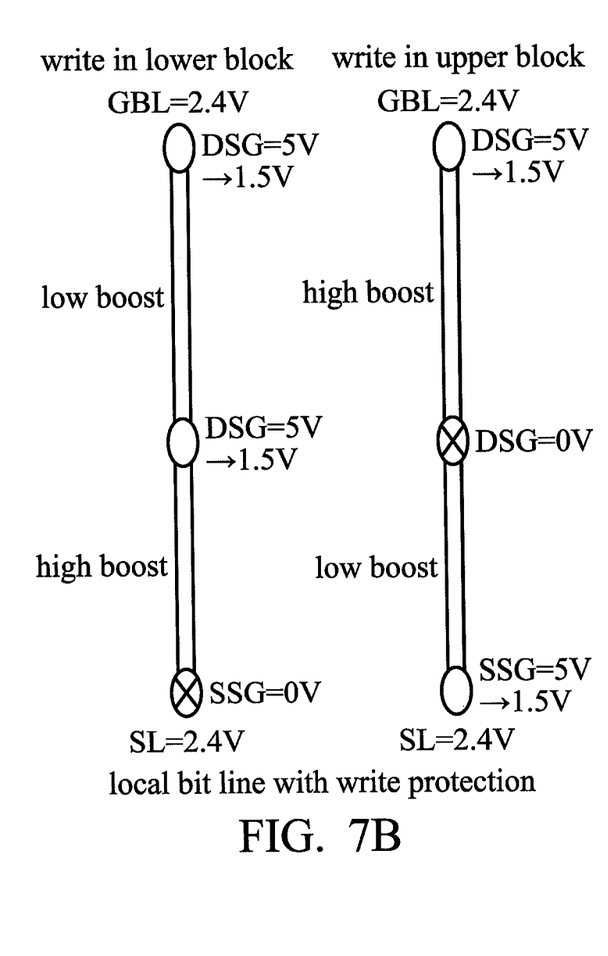

FIGS. 7A and 7B are diagrams illustrating a status of the local bit line (channel) when data writing in the upper block and the lower block is processing. FIG. 7A is diagram illustrating the voltage status of the written local bit line in the case of data writing in the upper block and the lower block, and FIG. 7B is diagram illustrating the voltage status of the local bit line with write protection in the case of data writing in the upper block and the lower block.

Regard to FIG. 7A, when writing in the upper block is performed, the dummy selection transistor DSEL is turned off, the local bit line of the lower block is pre-charged by the voltage from the source line, and a voltage with 4.2V drives the word line, so that the local bit line is boosted to a lower voltage. Also, as shown in FIG. 7B, due to the local bit line with write protection being pre-charged by the power voltage from the source line SL, the written local bit line is boosted to a lower voltage when a voltage with 4.2V drives the word line.

Regard to FIG. 7A, when writing in the lower block is performed, the dummy selection transistor DSEL is turned on, the source selection transistor SEL-S, the voltage of the local bit lines of the upper block and the lower block is 0V. On the other hand, due to the local bit line with write protection, as shown in FIG. 7B, being pre-charged by the globe bit line, the upper block is boosted to a lower voltage, and the lower block is boosted to a higher voltage according to the driving of the word line. Meanwhile, due to the dummy selection line voltage decreasing to 1.5V, the leakage current from the local bit line of the lower block to the local bit line of the upper block is reduced. Therefore, due to the local bit lined with write protection in the upper block and the lower block having the same condition, although the block is divided for usage, the durability of the memory cells of the upper block can be the same as those of the memory cells of the lower block.

(Data Reading)

When reading a page date from the upper block or the lower block, a voltage with 1.2V is applied to the globe bit line GBL, a voltage with 0V is applied to the source line SL, and a voltage with 4.2V is applied to the drain selection line SGD, the dummy selection line DSG, and source selection line SGS for turning on the drain selection transistor SEL-D, the dummy selection transistor DSEL, and source selection transistor SEL-S. Also, a voltage with 0V is applied to the word line, and a voltage Vread with 4.5V is applied to the unselected word lines.

In the embodiment according to the invention, the block with 64 pages or the block with 32 pages in the flash memory can be used. According to the type of the stored data, the deletion of all the data in the block can be reduced. In this situation, deleting the data in the upper block or the lower block can prevent accidentally deleting necessary data in comparison with deleting all of the data in the whole block. In the other words, the channel current is not needed by the memory cells. Namely, the number of the times of electrons being captured in the tunnel oxide film is reduced, so that the number of the times of data rewriting is reduced, and aging in the storage character of the floating gate is reduced. Note that the same features described above can be obtained by using the method of data writing in the upper block or in the lower block.

Also note that the number of the pages in the disclosed embodiment is only for example, and any other number of pages can be implemented. For example, as the integration progresses, a block with 128 pages can be divided into two split blocks, and each split block have 64 pages. Further, a block with 128 pages can be divided into four split blocks. In this case, three dummy transistors are inserted between each two of the split blocks, respectively. Therefore, the delete, write, and read operations of the split block with 32 pages can be performed.

The embodiment shown in FIG. 1 discloses that the memory blocks are arranged in a row, but the invention is not limited thereto. For example, the memory blocks can be arranged at two sides of the word line selection circuit 150, and have the structure to select two pages by one word line. Also, the voltage values in the above embodiments are used for example, and the corresponding voltages should be adjusted appropriately, when the deletion voltage or the programming voltage decreases as the size of the flash memory decreases.

While the invention has been described by way of example and in terms of preferred embodiment, it is to be understood that the invention is not limited thereto. Therefore, the scope of the present invention shall be defined and protected by the following claims and their equivalents.

What is claimed is:

1. A semiconductor memory device, for writing or deleting data in a block, comprising:
   a memory array, comprising a plurality of blocks, wherein each block of the plurality of blocks formed by a plurality of cell units in a well; and
   a selection circuit, selecting one of the plurality of blocks, and selecting a memory cell of the cell unit of the selected block,
   wherein the cell unit comprises N memory cells connected in series, and a first selection transistor is coupled between a terminal of the N memory cells and a source line, a second selection transistor is coupled between another terminal of the N memory cells and a bit line, and a third selection transistor is coupled in the middle of the N memory cells,
   wherein the gates of the memory cells in the row direction in the block are connected to a word line, the gate of the first selection transistor is coupled to a first selection line, the gate of the second selection transistor is coupled to a second selection line, and the gate of the third selection transistor is coupled to a third selection line,
   wherein the selection circuit drives the word line, the first selection line, the second selection line and the third selection line, and utilizes the third selection transistor as a boundary to divide the block into a first block and a second block according to an operation of data writing or deleting, and
   wherein when writing data in the second block is processed, a programming voltage is applied to the gate of each memory cell in the second block via the word line the third selection transistor is turned off via the third selection line, a middle voltage which is sufficient to turn on the memory cell is applied to the gate of each memory cell in the first block via the word line, the first selection transistor is connected to the source line via the first selection line, and the second selection transistor is connected to the bit line via the second selection line.

2. The semiconductor memory device of claim 1, further comprising: a control circuit, controlling the selection circuit according to an instruction, wherein the instruction is whether the selection circuit divides the block.

3. The semiconductor memory device of claim 1, wherein when data deletion in the first block is processed, a first voltage is applied to the gate of each memory cell in the first block via the word line, the third selection transistor is floating via the third selection line, the memory cells in the second block are floating, the first selection transistor and the second selection transistor are floating, and a second voltage larger than the first voltage is applied to the well.

4. The semiconductor memory device of claim 1, wherein when data deletion in the second block is processed, a first voltage is applied to the gate of each memory cell in the second block via the word line, the third selection transistor is floating via the third selection line, the memory cells in the first block is floating, the first selection transistor and the second selection transistor are floating, and a second voltage larger than the first voltage is applied to the well.

5. The semiconductor memory device of claim 1, wherein when data deletion in the first block and the second block is processes, a first voltage is applied to the gate of each memory cell in the first block and the second block via the word line, the third selection transistor is floating via the third selection line, the first selection transistor and the second selection transistor are floating, and a second voltage larger than the first voltage is applied to the well.

6. The semiconductor memory device of claim 1, wherein when data writing in the first block occurs, a programming voltage is applied to the gate of each memory cell in the first block via the word line, the third selection transistor is turned on via the third selection line, a middle voltage which is sufficient to turn on the memory cell is applied to the gate of each memory cell in the second block via the word line, the first selection transistor is turned off by the first selection line, and the second selection transistor is connected to the bit line via the second selection line.

7. The semiconductor memory device of claim 6, wherein when writing data in the first block is processed, a local bit line of the cell units connected to a write protection line in the first block and the second block is pre-charged, and the local bit line of the first block is boosted in response to the middle voltage.

8. The semiconductor memory device of claim 1, wherein when writing data in the first block is processed, a local bit line of the cell units connected to a write protection line in the first block and the second block is pre-charged, and the local bit line of the second block is boosted in response to the middle voltage.

9. The semiconductor memory device of claim 1, wherein when reading data from the second block is processed, the word line provides a reading voltage to the gate of the selected memory cell, a middle voltage is applied to the gate of the unselected memory cell in the first block and the second block, and the third selection transistor is turned on via the third selection line.

10. The semiconductor memory device of claims 1, wherein each of the first block and the second block has N/2 word lines.

11. The semiconductor memory device of claim 2, wherein when data deletion in the first block is processed, a first voltage is applied to the gate of each memory cell in the first block via the word line, the third selection transistor is floating via the third selection line, the memory cells in the second block are floating, the first selection transistor and the second selection transistor are floating, and a second voltage larger than the first voltage is applied to the well.

12. The semiconductor memory device of claim 2, wherein when data deletion in the second block is processed, a first voltage is applied to the gate of each memory cell in the second block via the word line, the third selection transistor is floating via the third selection line, the memory cells in the first block is floating, the first selection transistor and the second selection transistor are floating, and a second voltage larger than the first voltage is applied to the well.

13. The semiconductor memory device of claim 2, wherein when data deletion in the first block and the second block is processes, a first voltage is applied to the gate of each memory cell in the first block and the second block via the word line, the third selection transistor is floating via the third selection line, the first selection transistor and the second selection transistor are floating, and a second voltage larger than the first voltage is applied to the well.

14. The semiconductor memory device of claim 2, wherein when data writing in the first block occurs, a programming voltage is applied to the gate of each memory cell in the first block via the word line, the third selection transistor is turned on via the third selection line, a middle voltage which is sufficient to turn on the memory cell is applied to the gate of each memory cell in the second block via the word line, the first selection transistor is turned off by the first selection line, and the second selection transistor is connected to the bit line via the second selection line.

15. The semiconductor memory device of claim 14, wherein when writing data in the first block is processed, a local bit line of the cell units connected to a write protection line in the first block and the second block is pre-charged, and the local bit line of the first block is boosted in response to the middle voltage.

16. The semiconductor memory device of claim 2, wherein when writing data in the second block is processed, a local bit line of the cell units connected to a write protection line in the first block and the second block is pre-charged and the local bit line of the second block is boosted in response to the middle voltage.

17. The semiconductor memory device of claim 2, wherein when reading data from the second block is processed, the word line provides a reading voltage to the gate of the selected memory cell, a middle voltage is applied to the gate of the unselected memory cell in the first block and the second block, and the third selection transistor is turned on via the third selection line.

* * * * *